(12) United States Patent
Ahmad

(10) Patent No.: US 7,274,265 B2
(45) Date of Patent: Sep. 25, 2007

(54) PWM CONTROLLER WITH TEMPERATURE REGULATION OF SWITCHING FREQUENCY

(75) Inventor: Faisal Ahmad, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 104 days.

(21) Appl. No.: 11/204,533

(22) Filed: Aug. 16, 2005

(65) Prior Publication Data
US 2006/0038627 A1 Feb. 23, 2006

Related U.S. Application Data

(60) Provisional application No. 60/602,477, filed on Aug. 18, 2004.

(51) Int. Cl.
*H03L 1/00* (2006.01)
(52) U.S. Cl. ........................... 331/176; 331/111
(58) Field of Classification Search ............ 331/66, 331/176, 111, 153
See application file for complete search history.

(56) References Cited

U.S. PATENT DOCUMENTS

| | | | | | |
|---|---|---|---|---|---|
| 3,911,374 | A | * | 10/1975 | Busse et al. | 331/65 |
| 4,928,218 | A | * | 5/1990 | Kluttz | 363/37 |
| 5,498,995 | A | * | 3/1996 | Szepesi et al. | 327/538 |
| 6,356,161 | B1 | * | 3/2002 | Nolan et al. | 331/176 |

* cited by examiner

*Primary Examiner*—Joseph Chang
(74) *Attorney, Agent, or Firm*—Ostrolenk, Faber, Gerb & Soffen, LLP

(57) ABSTRACT

A circuit for controlling the switching frequency of an oscillator for a PWM controller for a switching mode power supply, comprising a first stage providing a signal which is related to the temperature of the controller for the switching mode power supply; and an oscillator having an oscillation frequency and being responsive to the signal from the first stage for changing the oscillation frequency such that the oscillation frequency decreases as the temperature increases and vice versa.

10 Claims, 1 Drawing Sheet

PWM CONTROLLER WITH TEMPERATURE REGULATION OF SWITCHING FREQUENCY

CROSS-REFERENCE TO RELATED APPLICATIONS

Figure 1:
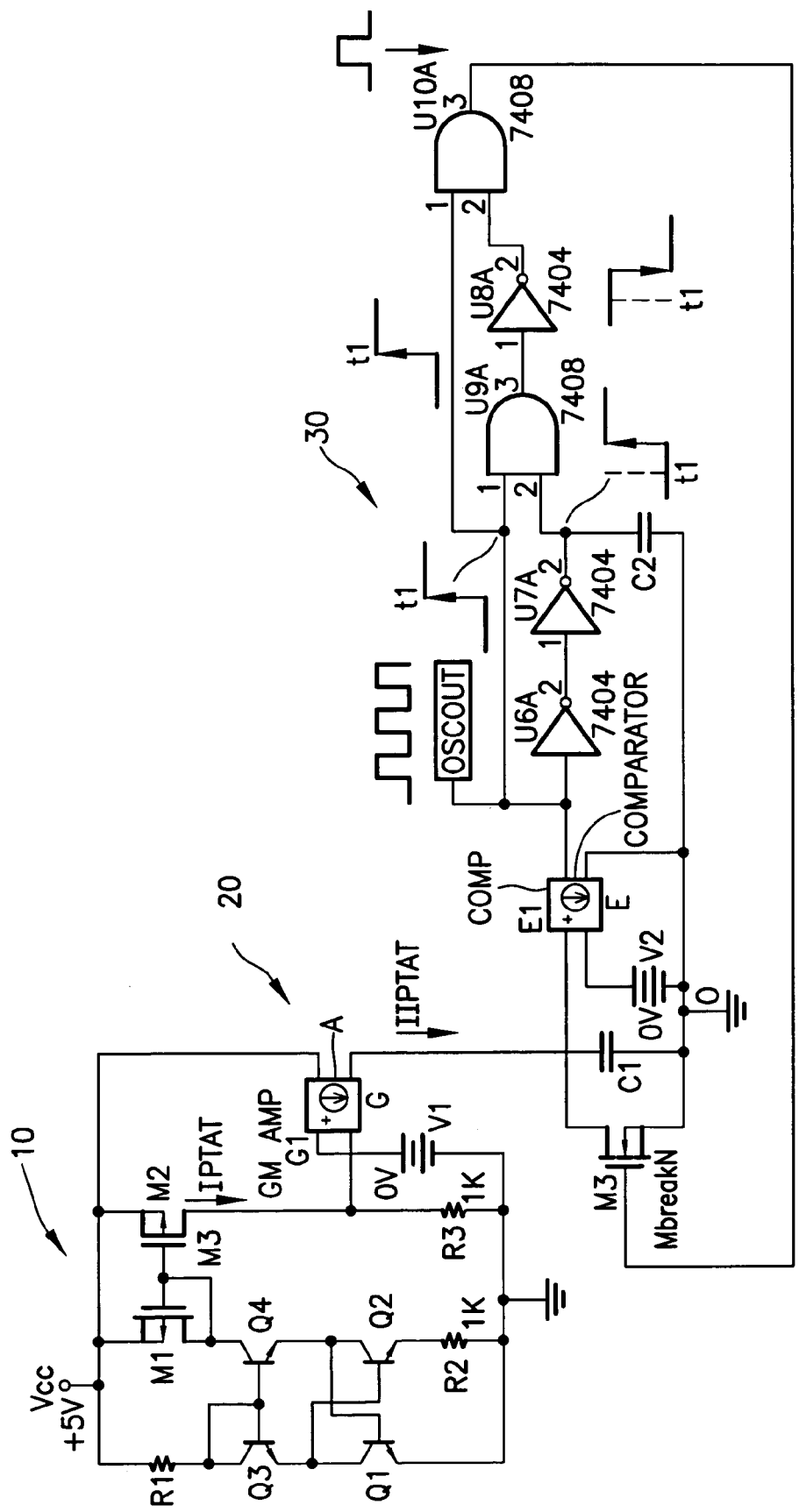

The present invention claims the benefit and priority of U.S. Provisional Application Ser. No. 60/602,477 filed Aug. 18, 2004 entitled TEMPERATURE REGULATION IN PWM CONTROLLER, the entire disclosure of which is incorporated by reference herein.

BACKGROUND OF THE INVENTION

The present invention relates to switching mode power supplies, and in particular, to switching mode power supply controllers utilizing pulse width modulation to control the on times of the power transistor output stages. In such switching mode PWM controllers, the designs are using higher switching frequencies to take advantage of the reduced inductance/magnetic sizes that can be used at these frequencies. A major disadvantage or operating at higher switching frequencies is the increased switching and gate drive losses, resulting in lower system efficiency and increased board heat, that is, a rise in temperature. In certain applications, this increase in temperature cannot be tolerated due to reliability and system integrity concerns.

In the prior art, it is known that some PWM control ICs have a feature whereby the controller enters a hysteretic or "light load" mode. The controller enters this mode under low output current conditions, and the regulator only delivers power to maintain the output voltage. Consequently, the switching frequency can vary. This method is intended to reduce power loss to extend battery life in battery-powered applications. However, this prior art circuit does not provide for reduction in switching frequency as the temperature of the circuit increases. Further, it applies to a hysteretic mode converter whereby the power transistor turns on only to maintain the output voltage. Given this control, the frequency can vary depending on the output load. According to the present invention, it is desired to provide a controller which operates in a pulse width modulation mode whereby the switching frequency is maintained in a constant frequency operation but will change as a function of temperature changes. Accordingly, in contrast to the hysteretic converters wherein the switching frequency constantly changes as a function of output load, the present invention changes the switching frequency based on temperature change during steady state PWM operation.

SUMMARY OF THE INVENTION

According to the invention, a PWM control circuit is provided to adjust the switching frequency of the switching regulator in order to regulate the temperature of the circuit and maintain system integrity. The circuit may be an integrated circuit. This circuit comprises the following:

A temperature sensing circuit which uses the temperature dependence of a semiconductor device, for example, a bipolar transistor, to create a current source which is proportional to absolute temperature.

An amplifier circuit which acts as a voltage controlled current source. The current proportional to the absolute temperature is fed to a resistor to create a voltage proportional to the absolute temperature. This voltage is fed to a first input of the amplifier. The second input is tied to a nominal reference voltage. The output of this circuit is a current which is inversely proportional to temperature.

An oscillator circuit which uses the current inversely proportional to temperature and a capacitor to set the switching frequency.

With this circuit, as the temperature in the system increases, the switching frequency will consequently decrease, therefore reducing power loss and reducing the temperature thereby providing a temperature regulation circuit for the PWM switching controller.

In accordance with the above, the invention comprises a circuit for controlling the switching frequency of an oscillator for a PWM controller for a switching mode power supply, comprising a first stage providing a signal which is related to the temperature of the controller for the switching mode power supply; and an oscillator having an oscillation frequency and being responsive to the signal from the first stage for changing the oscillation frequency such that the oscillation frequency decreases as the temperature increases and vice versa.

Other objects, features and advantages of the present invention will become apparent from the detail description which follows.

BRIEF DESCRIPTION OF THE DRAWING(S)

The invention will now be described in greater detail in the following detailed description with reference to the drawings in which FIG. 1 shows a circuit diagram of the circuit according to the invention for regulating the switching frequency of the oscillator controlling the PWM switching frequency in accordance with temperature.

DETAILED DESCRIPTION OF PREFERRED EMBODIMENTS OF THE INVENTION

With reference now to the drawing figure, FIG. 1 shows a circuit according to the invention. The circuit comprises three portions: a temperature sensing circuit 10, an amplifier 20 and an oscillator 30.

In the illustrated embodiment, the temperature sensing circuit is made a part of the switching controller so that it responds to the temperature of the switching controller circuit. The switching controller circuit may be disposed in an integrated circuit package and will control the output stage of a switching mode power supply which may comprise at least one power output transistor such as a power MOSFET. This is not shown. However, the power MOSFET will have its gate controlled by a pulse width modulated signal from a controller whose switching frequency is controlled by the oscillator circuit according to the present invention. The on time of the output transistor is pulse width modulated to control the output voltage. In many applications, the output stage will comprise two output transistors connected across a DC bus voltage in a boost or buck configuration to boost or reduce the DC bus voltage to the required voltage. However, the switching mode power supply output stage can be any type of switching mode output stage other than a buck or boost stage.

With reference to FIG. 1, the temperature sensing stage comprises, in the illustrated embodiment, bipolar transistors Q1, Q2, Q3 and Q4, in the illustrated embodiment, NPN bipolar transistors, which are coupled between a voltage source VCC and ground. In the current generator circuit, Q3 and Q4 force the current in each leg to be equal. Q2 is sized for example, 8 times larger than Q1 which creates a difference in Vbe voltage of Q1 (Vbe1) and Q2 (Vbe2). This difference, DeltaVbe, shows up across resistor R2 and sets the current (IPTAT) which is now proportional to absolute temperature. This current is mirrored by the current mirror of M1-M2 and creates a voltage proportional to absolute temperature across resistor R3. This voltage feeds into the GM amplifier A which then adjusts the oscillator current to regulate the converter frequency.

The voltage across resistor R3 proportional to IPTAT is coupled to the inverting input of the transconductance amplifier A. The non-inverting input of the amplifier A is coupled to a nominal reference voltage V1. The output of the amplifier A is a current inversely proportional to absolute temperature (IIPTAT) and charges a capacitor C1 of an oscillator 30. When the voltage across the capacitor C1 increases above the threshold V2 of the comparator COMP, the comparator switches high and a voltage is provided to two legs of the oscillator circuit. In one leg comprising inverters U6A and U7A which provide a delayed pulse across a capacitor C2. The undelayed signal and the delayed signal are coupled to an AND gate U9A and the delayed rising edge is coupled to a further inverter stage U8A which provides a falling edge. The undelayed rising edge and the falling edge from inverter U8A are coupled to a further AND gate U10A to provide a pulse output. The pulse output is provided back to the gate of a MOSFET M3 to discharge the capacitor after the delay time which allows the capacitor to again be charged by the current IIPTAT to restart the oscillator cycle. Depending upon the value of the current IIPTAT, the capacitor will be charged at a rate inversely proportional to the absolute temperature. Thus, if the temperature increases, the capacitor will take longer to charge, thereby reducing the switching frequency. If the absolute temperature decreases, the current IIPTAT will increase, thus allowing the capacitor to charge more quickly, decreasing the switching frequency. The oscillator output is shown at OSCOUT.

Accordingly, as the temperature increases, the switching frequency is decreased to reduce switching losses.

The present invention provides a number of advantages. It prevents system overheating while still delivering full load current at the specified output voltage. The reduced switching frequency is maintained in a constant frequency operation (steady state) mode, which does not introduce unwanted noise into the system. The invention can take advantage of allowing smaller magnetic/inductive components at higher frequencies without the concern of system overheating.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. A circuit for controlling the switching frequency of an oscillator for a PWM controller for a switching mode power supply, comprising:
   a first stage providing a signal which is related to the temperature of the controller for the switching mode power supply; and
   an oscillator having an oscillation frequency and being responsive to the signal from the first stage for changing the oscillation frequency such that the oscillation frequency decreases as the temperature increases and the oscillation frequency increases as the temperature decreases.

2. The circuit of claim 1, wherein the first stage comprises:
   a first circuit responsive to the temperature of the controller and providing a current proportional to the absolute temperature of the controller; and
   a second circuit responsive to the current proportional to the absolute temperature from the first circuit and providing a second current inversely proportional to the absolute temperature and wherein the current inversely proportional to the absolute temperature is provided to the oscillator circuit such that as the temperature increases, the oscillation frequency of the oscillator reduces.

3. The circuit of claim 2, wherein the first circuit comprises:
   at least one bipolar transistor responsive to the absolute temperature of the controller; and
   wherein the second circuit comprises an amplifier stage having an inverting input and a non-inverting input with said current proportional to the absolute temperature being fed through a resistor coupled to said non-inverting input to provide a voltage proportional to the absolute temperature, and whereby said amplifier produces an output comprising said current inversely proportional to the absolute temperature.

4. The circuit of claim 3, wherein said current inversely proportional to the absolute temperature charges a timing capacitor, said timing capacitor being coupled to an input of a comparator, the comparator providing an output when the voltage across said capacitor exceeds a predetermined reference voltage coupled to said comparator.

5. The circuit of claim 4, wherein the oscillator circuit comprises at least one delay stage and a feedback line for discharging said capacitor after a delay time implemented by said delay stage.

6. The circuit of claim 5, wherein the oscillator comprises a controlled switch controlled by said feedback line for discharging said capacitor.

7. A method for controlling the switching frequency of an oscillator for a PWM controller for a switching mode power supply, comprising:
   providing a first signal which is related to the temperature of the controller for the switching mode power supply; and
   controlling an oscillator having an oscillation frequency in response to the first signal by changing the oscillation frequency such that the oscillation frequency reduces as the temperature increases and as the temperature decreases, the oscillator frequency of the oscillator increases.

8. The method of claim 7, wherein the step of providing a first signal comprises:
   providing a current proportional to the absolute temperature of the controller; and
   responsive to the current proportional to the absolute temperature, providing a second current inversely proportional to the absolute temperature and providing the current inversely proportional to the absolute temperature to the oscillator such that as the temperature increases, the oscillation frequency of the oscillator decreases.

9. The method of claim 8, wherein the step of providing a current proportional to the absolute temperature comprises:
   providing at least one bipolar transistor responsive to the absolute temperature of the controller; and providing an amplifier stage having an inverting input and a non-inverting input with said current proportional to the absolute temperature being fed through a resistor coupled to said non-inverting input to provide a voltage proportional to the absolute temperature, and whereby said amplifier produces an output comprising said current inversely proportional to the absolute temperature.

10. The method of claim 9, further comprising charging a timing capacitor with said current inversely proportional to the absolute temperature, and providing a voltage across said timing capacitor to an input of a comparator for providing an output when the voltage across said capacitor exceeds a predetermined reference voltage coupled to said comparator.

* * * * *